(12) United States Patent
Mathieu

(10) Patent No.: US 6,522,308 B1
(45) Date of Patent: Feb. 18, 2003

(54) VARIABLE CAPACITANCE COUPLING ANTENNA

(75) Inventor: Christophe Mathieu, Saint-Marcel (FR)

(73) Assignee: Ask S.A., Valbonne (FR)

( * ) Notice: Subject to any disclaimer, the term of this patent is extended or adjusted under 35 U.S.C. 154(b) by 0 days.

(21) Appl. No.: 09/914,236

(22) PCT Filed: Jan. 2, 2000

(86) PCT No.: PCT/FR01/00010

§ 371 (c)(1), (2), (4) Date: Aug. 24, 2001

(87) PCT Pub. No.: WO01/50547

PCT Pub. Date: Jul. 12, 2001

(30) Foreign Application Priority Data

Jan. 3, 2000 (FR) .............................................. 00 00209

(51) Int. Cl.$^7$ .............................................. G08B 13/14
(52) U.S. Cl. ...................... 343/895; 340/572.5; 343/841
(58) Field of Search .......................... 343/895, 700 MS, 343/741, 742, 743, 744, 745, 749, 866; 340/572.5

(56) References Cited

U.S. PATENT DOCUMENTS

| 5,781,110 A | * | 7/1998 | Habeger, Jr. et al. ....... 340/572 |
| 5,995,054 A |   | 11/1999 | Massey ....................... 343/744 |
| 6,018,298 A | * | 1/2000 | Endo et al. .............. 340/572.5 |

FOREIGN PATENT DOCUMENTS

| WO | WO 91/15878 | 10/1991 |
| WO | WO 00/72255 | 11/2000 |

\* cited by examiner

*Primary Examiner*—Don Wong
*Assistant Examiner*—James Clinger
(74) *Attorney, Agent, or Firm*—James C. Lydon

(57) ABSTRACT

The invention thus concerns a coupling antenna connected to an electromagnetic wave transceiver device containing one or several integrated capacitors. This coupling antenna includes at least one screen printed turn (24) on a support (28) consisting of an insulating dielectric support and also includes a screen printed capacitor on the support, connected in parallel, thereby reducing the capacitance supplied by the capacitor(s) built into the device, so that the resulting capacitance forms a resonating circuit with the turn. The invention also concerns the fabrication process of such an antenna and the use of this antenna in a contactless or hybrid contact-contactless smart card.

11 Claims, 3 Drawing Sheets

VARIABLE CAPACITANCE COUPLING ANTENNA

TECHNICAL FIELD

This application is a U.S. National Stage of International application PCT/FR01/00010, filed Jan. 2, 2001 and published on Jul. 12, 2001 in the French Language.

The present invention concerns contactless transceiver systems, and particularly a coupling antenna with a screen printed capacitor, particularly used in contactless or hybrid contact-contactless smart cards.

BACKGROUND ART

The contactless smart card is a system being used increasingly in various sectors. In the transport sector, the card has been developed as a means of payment. This is also the case of the electronic wallet. Many companies have also developed identification means for their personnel using contactless smart cards.

The exchange of information between the contactless card and the associated reader is accomplished by remote electromagnetic coupling between an antenna lodged in the contactless card and a second antenna located in the reader. For developing, storing and processing the information, the card is equipped with a chip or an electronic module which is connected to the antenna. The antenna and the chip are typically located on a dielectric support made of plastic material (polyvinyl chloride (PVC), polyester (PET), polycarbonate (PC) . . . ). The antenna is obtained by chemical copper or aluminum etching on the support or winding of conductive metal wire. The chip, including a memory zone and a microprocessor, contains capacitors which define an input capacitance associated with the chip. The optimal operation of the antenna-chip coupling, which must not be resistive, is obtained when the following circuit resonance law is observed:

$$LC\omega^2 = 1 \tag{1}$$

in which L represents the inductance of the antenna, C represents the input capacitance and $\omega$ the pulse equal to $2\pi f$, in which f represents the normalized frequency (for example, 13.56MHz).

The obligation to observe this law requires chip manufacturers, also called founders, to integrate adequate capacitors in the chips in order to obtain sufficiently high capacitance values. In this manner, the production cost of the chips is necessarily higher due to the presence of capacitors.

The development of contactless smart cards inevitably includes reducing the production cost of the chips used in these cards. In order to reduce the cost of the chips, founders have been increasingly led to reduce the size of the capacitor built into the chips and to thereby reduce the input capacitance of the circuit. In this manner, manufacturers can produce smaller chips.

In order to observe the law $LC\omega^2 = 1$ and to obtain optimal coupling, the inductance L of the antenna has been increased in order to compensate the decrease in the chip's input capacitance value. In the case of antennas made by using copper or aluminum etching techniques, in the form of turns on a plastic dielectric support, the inductance was increased by augmenting the number of turns. This solution, however, causes several major drawbacks. Indeed, since all electric circuits have a certain resistance, increasing the number of turns, which essentially corresponds to an increase in the circuit's length, leads to a significant increase in the value of this resistance. This considerably affects the antenna's performance characteristics and thus that of the card as well. The distance between the reader and the card is reduced significantly.

In order to limit the overall dimensions and to maintain the effective area for the electromagnetic flow through the card, the width of the copper tracks must be reduced. As a result, the resistance of the antenna is increased and, above all, the reliability of the cards is downgraded as there is a higher risk of the antenna turns breaking when the card bodies are subjected to the hot lamination operation under pressure.

The unit cost of the engraved antenna increases considerably. Thus, the cost reductions obtained by the founders with chips having a lower input capacity are cancelled out by the supplementary cost of the antennas. Card fabrication and use are thus not more profitable.

Displacing the capacitance of the chip towards the antenna, by connecting one or more capacitors directly to the antenna is not an acceptable solution either. Traditional capacitors are costly, which does not solve the card cost problem. Furthermore, placing capacitors on the support and connecting them to the antenna is not easy.

DISCLUSURE OF THE INVENTION

The purpose of the invention is to mitigate these drawbacks by supplying an antenna with a parallel capacitance obtained at a lesser cost, thereby obtaining a smart card which is considerably less expensive in relation to the cost of smart cards currently available on the market, owing to the reduction in the number of capacitors in the chip.

The invention thus concerns a coupling antenna connected to an electromagnetic wave transceiver device containing one or several integrated capacitors. This coupling antenna includes at least one screen printed turn on a support consisting of an insulating dielectric support and also includes a screen printed capacitor on the support, connected in parallel, thereby reducing the capacitance supplied by the capacitor(s) built into the device, so that the resulting capacitance forms a resonating circuit with the turn.

The invention also concerns a manufacturing process of this antenna which consists in:
   screen printing at least one antenna turn, the lower plate of the capacitor, bonding pads from the antenna to a chip or a module, and the connection from the antenna to the lower plate of the capacitor, by depositing conductive ink onto the support,
   performing a second screen print of the capacitor's insulating strip by depositing dielectric ink, thereby allowing the lower plate of the capacitor to be covered,
   performing a third screen printing of the capacitor's upper plate and the connection of the antenna to the upper plate of the capacitor.

BRIEF DESCRIPTION OF FIGURES

The purposes, objects and characteristics of the invention will become more apparent from the following description when taken in conjunction with the accompanying drawings in which.

DETAILED DESCRIPTION OF THE INVENTION

Figure 1:
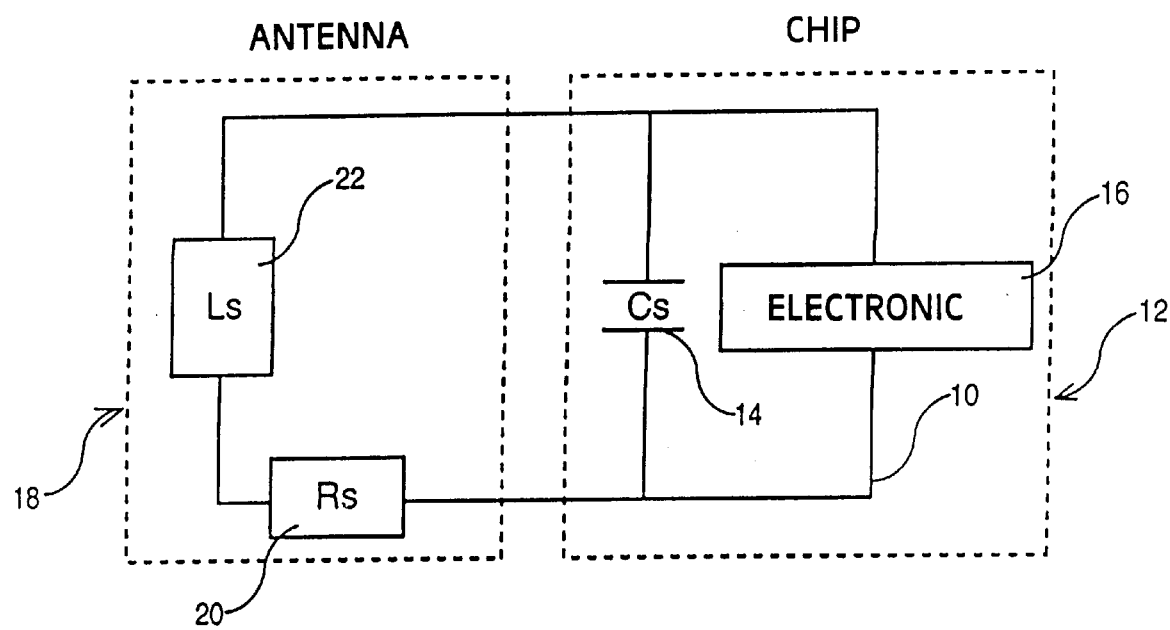
FIG. 1 represents the circuit diagram of a traditional contactless smart card.

According to FIG. 1, the electric circuit of a smart card 10 is subdivided into two components: the antenna and the chip. The chip 12 has an internal capacitance Cs 14 obtained via capacitors located in the chip. It also has an electronic part 16 corresponding to the memory zone and the processor. The chip 12 is connected to the antenna 18 by means of the circuit 10. The antenna 18 has an inductance Ls 22 which gives a resistance Rs 20.

Figure 2:
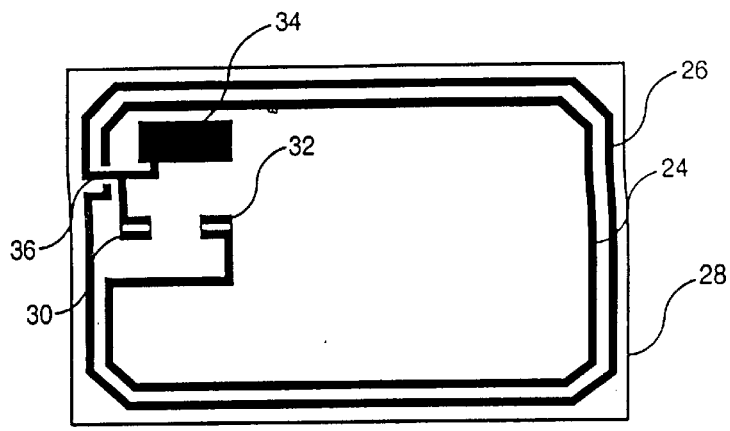
FIG. 2 represents the coupling antenna according to a special embodiment, at the end of this first fabrication step.
Figure 3:
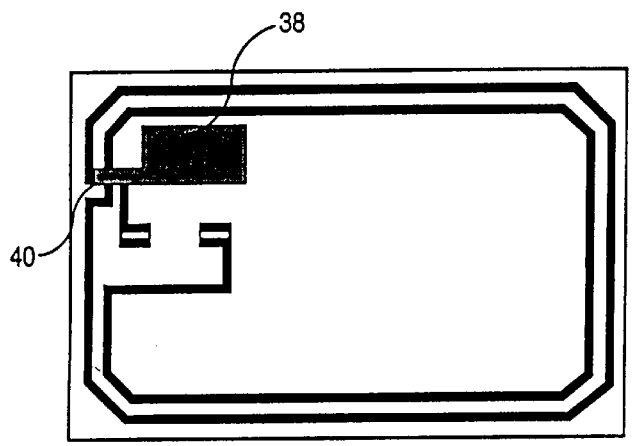
FIG. 3 represents the coupling antenna according to the invention, after the second fabrication step.
Figure 4:
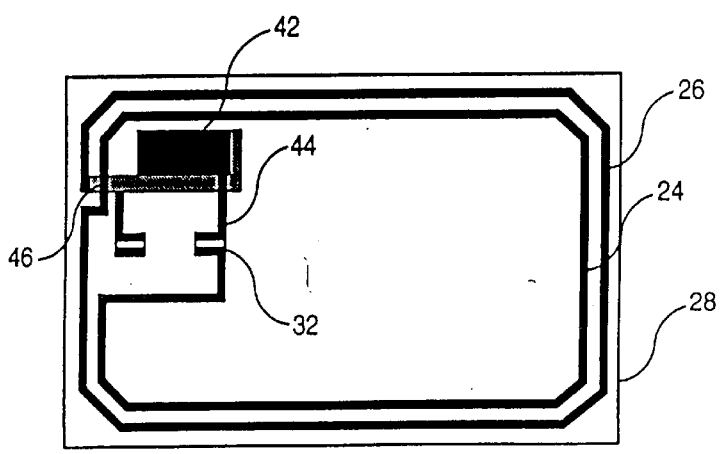
FIG. 4 represents the coupling antenna according to the invention, after the last fabrication step.

FIGS. 2, 3 and 4 represent the antenna after the three main fabrication steps. According to a particular embodiment, the antenna consists of two turns in series and a screen printed capacitor. During the first step of the fabrication process, represented in FIG. 2, the two turns 24 and 26 are screen printed on the support 28 consisting of an insulating dielectric substrate. The two bonding pads, 30 and 32, are screen printed at the same time enabling the antenna to be connected to the chip, and the lower plate 34 of the capacitor. One end of the turn 26 is connected to the plate 34 and to the bonding pad 30 by an electric bridge 36. The other end of the turn 26 remains unconnected. The end of turn 24 is connected to bonding pad 32 and the other remains unconnected. The dielectric substrate is made of plastic, paper or glass fabric impregnated in thermosetting or U.V. shrink type resin. The plastic material used is, for example, polyvinyl chloride (PVC), polyester (PET, PETG), polycarbonite (PC), or acrylonitrile-butadiene-styrene (ABS). The conductive ink used contains polymers and is loaded with conductive elements which may be metals. The ink used is preferably loaded with silver. However, it may also be loaded with copper or carbon. The ink can thus contain between 50% and 70% silver in the form of beads or strips. The polymers used are polyesters or acrylic resins. The ink also contains a solvent which is used as a vehicle. According to a specific embodiment, the solvent is a glycol ether.

FIG. 3 shows the antenna after the second step of its fabrication process. A second screen printing operation is performed. This second screen printing operation corresponds to the deposit of dielectric ink forming an insulating strip 38 separating the capacitor plates. An insulating strip 40 is also screen printed on the electric bridge 36. According to a preferred embodiment, each layer is 25 microns thick. This ink contains polymers and cross-links when subjected to U.V. radiation. The polymers may be acrylate resins or unsaturated polyesters. Contrary to conductive ink, this ink does not contain solvent. The polymers contained in the ink will cross-link when the ink is subjected to U.V. radiation. This cross-linking causes the ink to harden. In this manner, the geometry of the capacitor is very stable and especially this insulating strip does not vary. As a result, the distance between the two plates does not vary either, which enables the capacitor and thus the antenna to maintain optimal operating quality. In order to be sufficiently insulating, this ink must have the highest possible relative permittivity. The value of the permittivity is generally greater than 3. In a preferred embodiment of the coupling antenna according to the invention, the permittivity of the ink used to screen print the insulating strip is 3.9. In order to provide the strip with good insulating characteristics, at least two layers of ink are required. In fact, after cross-linking, the layer of ink is highly porous which prevents it from having high insulating properties. In order to solve this problem, two successive and superimposed layers are screen printed and form a strip with high insulating properties. The insulating strip 38 is superimposed on plate 34 and entirely covers the latter. The insulating strip 40 also covers the electric bridge 36. This band allows the electric bridge to be insulated from the connection made between the free ends of turns 24 and 26 during the last step of the fabrication process.

FIG. 4 shows the antenna after the third and last step of its fabrication process. During this step, a third screen printing operation is performed to make the upper plate 42 of the capacitor which is superimposed on the insulating strip 38. A connection 44 is screen printed to connect the plate 42 to bonding pad 32 and to enable the capacitor to be connected to the antenna, in parallel. Finally, the connection 46 of the free ends of turns 24 and 26 is also screen printed.

Figure 5:
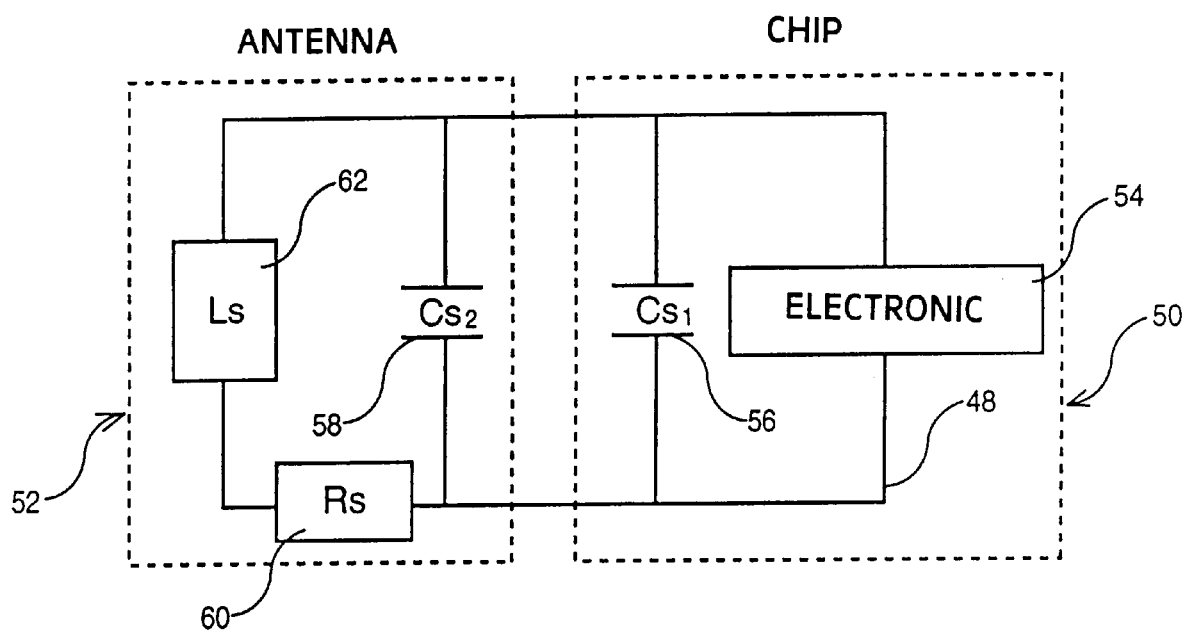
FIG. 5 represents the circuit diagram of a smart card featuring the coupling antenna according to the invention.

The antenna thus obtained consists of two turns connected in series and a capacitor. The circuit diagram of a smart card integrating this antenna is represented in FIG. 5.

The electric circuit 48 is divided into two parts: the chip 50 and the antenna 52. The chip 50 features an electronic part 54 corresponding to the memory zone and to the processor, and an internal capacitance $Cs_1$ 56. This capacitance is much lower than the internal capacitance of a traditional chip. This lower capacitance value is compensated by the capacitance value $Cs_2$ obtained with the antenna's screen printed capacitor 52. This antenna also features a resistance Rs 60 and a self-inductance Ls 62. The capacitance $Cs_2$ is variable and depends on the size of the capacitor. According to a preferred embodiment, the capacitance $Cs_2$ of the antenna is greater than the capacitance $Cs_1$ of the chip.

A smart card of this type consists of a plane support featuring at least one coupling antenna with at least one capacitor in parallel, connected to a chip or a module whose internal capacitance is low, or even zero according to a specific embodiment. According to a specific type of contactless smart card, the flat support is inserted between two card bodies, said card bodies being fixed on each side of said flat support in order to stiffen it. These card bodies may be made of plastic. In this case, the plastic used may be polyvinyl chloride (PVC), polyester (PET, PETG), polycarbonate (PC), or acrylonitrile-butadiene-styrene (ABS). When the card bodies are made of plastic, their fixation on each side of the support bearing on one or more antennas according to the invention, is made by hot or cold pressing of the three elements which make up the card, also referred to as hot or cold lamination.

In this manner, the coupling antenna obtained offers several important advantages. Fabricating a capacitor on the outside of the chip improves the performance characteristics of the card, particularly in comparison to a traditional card with a chip having the same internal capacitance.

The use of screen printing techniques enables a capacitor to be obtained with a certain degree of elasticity, making it more resistant to the mechanical stresses to which the card may be subjected during use. In this manner, the capacitance value does not change as a result of capacitor deterioration.

Furthermore, by modifying the parameters of capacitor, such as the surface area of the plates or the thickness of the insulating strip, it is possible to adjust the capacitance value to obtain perfect resonance. It is also possible to significantly vary the capacitance value without having to modify the fabrication process. An antenna and card fabrication process is thus obtained which can be easily and rapidly adapted to the stress introduced by the chip which has a defined and fixed internal capacitance.

Finally, the cost of a smart card featuring a coupling antenna with a screen printed capacitor is incomparable to the cost of a smart card having a more traditional antenna such as a copper engraved antenna, and a chip with high internal capacitance. Moreover, this cost reduction is still greater as the manufacturing process of such cards is not more difficult to implement, since antenna turns and/or capacitor(s) are screen printed simultaneously.

What is claimed is:

1. A coupling antenna, connected to an electromagnetic wave transceiver device containing one or several built-in capacitors, said coupling antenna comprising at least one screen printed turn on a support consisting of an insulating dielectric substrate;

wherein said antenna also includes a capacitor having a first plate, an insulating layer and a second plate which are screen printed on said support, one end of said antenna being coupled to said first plate of said capacitor and the other end of said antenna being coupled to said second plate so that said capacitor is connected in parallel to said antenna, thus reducing the capacitance supplied by the built-in capacitor(s) in said device, so that the resulting capacitance forms a resonating circuit with said turn.

2. The coupling antenna according to claim 1, in which said capacitor consists of at least two plates of screen printed ink, superimposed and separated by a insulating strip of dielectric ink which is also screen printed.

3. The coupling antenna according to claim 1, in which the dielectric substrate forming the support is made of plastic material, paper or glass fabric impregnated with thermosetting or U.V. shrink resin.

4. The coupling antenna according to claim 1, in which the ink used to screen print the turns and capacitor plates is a polymer conductive ink charged with conductive elements.

5. The coupling antenna according to claim 2, in which said insulating strip is made up of at least two layers of dielectric ink giving it high insulating properties.

6. The coupling antenna according to claim 5, in which the dielectric ink forming the two layers of the insulating strip is a U.V. shrink type polymer ink.

7. A contactless smart card made up of a support featuring at least one coupling antenna according to claim 1, connected to a chip or a module.

8. The contactless smart card according to claim 7, in which said chip or said module have no internal capacitance.

9. The contactless smart card according to claim 7, in which the support is inserted between two card bodies, said card bodies being fixed to each side of said support, enabling said smart card to be stiffened.

10. The contactless smart card according to claim 9, in which the card body is fixed to the support of the antenna by hot or cold lamination.

11. A coupling antenna fabrication process comprising:

screen printing at least one antenna turn, the lower plate of a capacitor, antenna bonding pads of said antenna to one of a chip or a module, and a connection of the antenna to said lower plate of the capacitor, by depositing conductive ink onto a support, performing a second screen printing of an insulating strip of said capacitor, by depositing dielectric ink upon the lower plate of the capacitor, performing a third screen printing of the upper plate of said capacitor superimposed on said insulating strip, and the connection of the antenna to said upper plate of said capacitor.

* * * * *